US011915739B2

(12) United States Patent
Becker et al.

(10) Patent No.: US 11,915,739 B2
(45) Date of Patent: Feb. 27, 2024

(54) ON-CHIP DEVICE TESTING CIRCUIT THAT GENERATES NOISE ON POWER BUS OF MEMORY DEVICE

(71) Applicant: Micron Technology, Inc., Boise, ID (US)

(72) Inventors: Eric A. Becker, Boise, ID (US); Tyler J. Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 170 days.

(21) Appl. No.: 17/558,512

(22) Filed: Dec. 21, 2021

(65) Prior Publication Data
US 2023/0197138 A1   Jun. 22, 2023

(51) Int. Cl.
| G11C 5/14 | (2006.01) |
| G06F 7/58 | (2006.01) |
| G11C 11/401 | (2006.01) |
| G11C 11/4074 | (2006.01) |
| G11C 11/4076 | (2006.01) |

(52) U.S. Cl.
CPC .......... *G11C 11/4074* (2013.01); *G06F 7/584* (2013.01); *G11C 5/14* (2013.01); *G11C 5/143* (2013.01); *G11C 11/401* (2013.01); *G11C 11/4076* (2013.01); *G06F 2207/581* (2013.01)

(58) Field of Classification Search
CPC .... G11C 11/4074; G11C 11/4076; G11C 5/14
See application file for complete search history.

(56) References Cited

U.S. PATENT DOCUMENTS

| 5,883,521 | A * | 3/1999 | Nishikawa ......... G01R 31/3173 365/201 |
| 2003/0083840 | A1* | 5/2003 | Corr ................. G01R 31/31937 702/117 |
| 2009/0049339 | A1* | 2/2009 | Cases ..................... G11C 29/56 714/29 |
| 2012/0049947 | A1* | 3/2012 | Arsovski ............... G06F 30/367 702/69 |
| 2014/0078815 | A1* | 3/2014 | Hollis ...................... G11C 7/02 365/189.11 |
| 2019/0221245 | A1* | 7/2019 | Arai ..................... G11C 29/028 |
| 2019/0259441 | A1* | 8/2019 | Ho .................... G11C 29/50012 |
| 2022/0343963 | A1* | 10/2022 | Lee .......................... G11C 5/147 |
| 2023/0030630 | A1* | 2/2023 | Goh ...................... G11C 29/021 |

* cited by examiner

*Primary Examiner* — Mushfique Siddique
(74) *Attorney, Agent, or Firm* — Perkins Coie LLP

(57) ABSTRACT

An apparatus having a power bus supplying power to a component of a memory device. The apparatus includes a noise source circuit generating a plurality of noise source signals that simulate a real-world noise. The apparatus can include a pulse generator circuit that receives the noise source signal and outputs at least one noise profile signal based on the noise source signal. A bus shorting circuit can be connected to the pulse generator circuit to receive the at least one noise profile signal. The bus shorting circuit can have at least one transistor connected between a first rail and a second rail of the power bus. Based on the at least one noise profile signal, the bus shorting circuit intermittently connects the at least one transistor between the first rail to the second rail to induce noise on the power bus.

17 Claims, 4 Drawing Sheets

ON-CHIP DEVICE TESTING CIRCUIT THAT GENERATES NOISE ON POWER BUS OF MEMORY DEVICE

TECHNICAL FIELD

The present disclosure generally relates to on-chip test circuits, and more particularly, to an on-chip device testing circuit that generates noise on a power bus of a memory device.

BACKGROUND

As memory circuits in an apparatus get more complex and/or dense, there can be limited access to test internal components of the memory device. In such cases, memory testing techniques that employ testers that are external to memory device may not be practical and/or provide inadequate results. For example, prior to shipping memory devices, a certain percentage of the memory devices are removed for testing to determine if certain components and/or power buses within the memory device may be susceptible to failure due to manufacturing and/or design flaws. In-shop testers are used in determining which components and/or buses are subject to failure. However, the in-shop testers may not be able to target sensitive areas in the memory device such as buses and components in the data path, clock path, and/or the read/write path. Without the ability to target locations of interest, it can be difficult to determine which components have actually failed. In addition, in-shop testers are generally very clean with respect to the noise induced on the power buses. As such, the in-shop testers may not accurately simulate real-world conditions where there is noise on the power bus and/or the components. This can mean inaccurate results and/or waiting a long time for components to fail.

For the reasons stated above, and for other reasons stated below which will become apparent to those skilled in the art upon reading and understanding the present specification, there is a need in the art for device testing circuits (e.g., on-chip testing circuits) that can target the location of interest and/or simulate and/or exaggerate real-world conditions.

DETAILED DESCRIPTION

Figure 1:
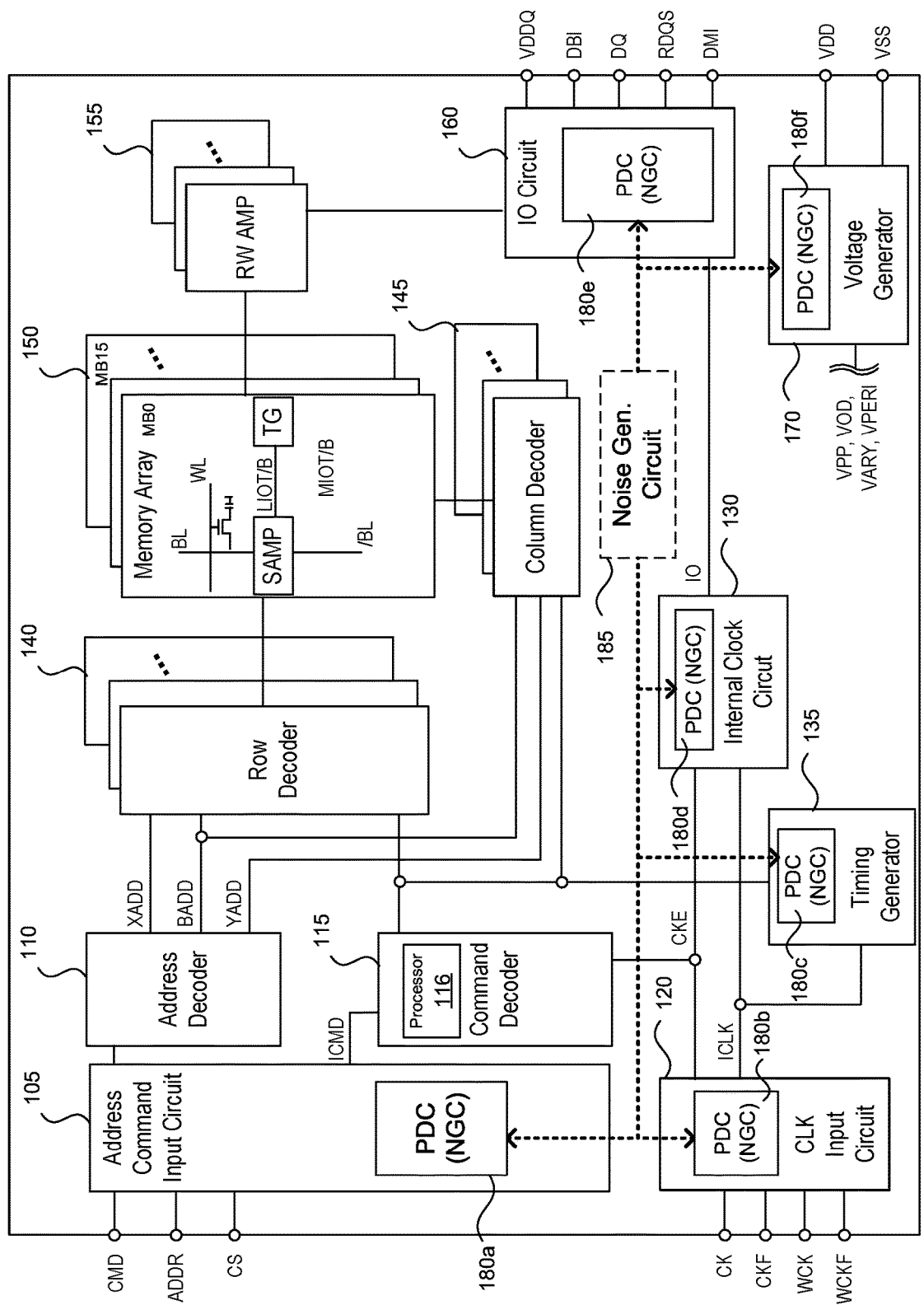
FIG. 1 is block diagram of an embodiment of a memory device with on-chip device testing circuits in accordance with the present disclosure.

Apparatuses in accordance with embodiments of the present disclosure can include memory storage devices and associated control circuits. The memory storage device can have memory regions (e.g., NAND memory regions, DRAM memory regions, etc.), logic gates, timers, counters, latches, shift registers, microcontrollers, microprocessors, field programmable gate arrays (FPGAs), sensors, and/or other integrated circuitry. The apparatuses can also include other circuit components, such as multiplexers, decoders, buffers, read/write drivers, address registers, data out/data in registers, etc., for accessing and/or processing data and other functionality, such as, for example, programming memory cells of a memory region and/or communicating with controllers and/or host devices. The memory device can include dynamic random access memory (DRAM) (including, e.g., DDR3, DDR4, DDR5), 3-D memory including high bandwidth memory (HBM) (having, e.g., DRAM, NOR, PCM, RRAM, MRAM), read only memory (ROM); erasable programmable ROM (EPROM); electrically erasable programmable ROM (EEPROM); ferroelectric and other storage media, including volatile storage media. In addition, the memory storage device can have one or more on-chip device testing circuits that can facilitate the testing of the above components of the memory device by inducing noise on the power buses of the components being tested.

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Embodiments of the present technology are directed to an apparatus with a bus supplying power to one of to one or more components of a memory device. The power bus has a first rail and a second rail with the first rail at a higher potential than the second rail. For example, the first rail can be at a high voltage potential (e.g., Vdd) for the memory device and the second rail can correspond to a low voltage potential (e.g., Vss) of the memory device. That is, in some embodiments, there is a difference in potential between the first rail and the second rail with the first rail being at a higher potential than the second rail. The apparatus can also include a bus shorting circuit (e.g., pull-down circuit) that is connected between the first rail and the second rail of the power bus, and a pulse generator circuit that is operatively connected to the bus shorting circuit to intermittently connect the first rail to the second rail to induce noise on the power bus. In the following description, for clarity, exemplary embodiments of the present disclosure are discussed in terms of a pull-down circuit (e.g., with PMOS transistors) as the "bus shorting circuit." However, those skilled in the art will understand that other type circuits (e.g., pull-up circuits with, e.g., NMOS transistors, open/close switches, etc.) that permit the shorting of the positive rail of a power bus to the negative rail of the power bus can be used. In some embodiments, each power bus can have one or more bus shorting circuits (e.g., pull-down circuits) located along the power bus. In other embodiments, a bus shorting circuit (e.g., a pull-down circuit) can be connected to one or more power buses.

As will be appreciated by those skilled in the art, embodiments of the present disclosure provide on-chip solutions that facilitate the failure or degradation of components within a memory device by injecting or inducing noise in a controlled fashion during a testing process of the memory device. In addition, embodiments of the present disclosure can apply bus noise to targeted power supplies within the memory device. Thus, by simulating and/or exaggerating real-world noise in targeted areas, embodiments discussed herein allow a tester to "shake the box" in order to decrease the time for a sensitive component to fail, which speeds up the debugging process. As part of the debugging process the tester can determine how far from the "cliff" the memory device is by observing parameters such as clock-to-data time, the data relative to system commands, flip-flop or latch set-up and hold times, incorrect latency, etc. and/or looking for functional failures in the memory device.

FIG. 1 is a block diagram schematically illustrating a memory device 100 in accordance with an embodiment of the present technology. The memory device 100 may include an array of memory cells, such as memory array 150. The memory array 150 may include one or more banks MB (e.g., banks MB0 to MB15 in the example of FIG. 1), and each bank may include a plurality of word lines (WL), one or more bit lines (BL), and one or more memory cells arranged at intersections of the word lines and the bit lines. The selection of a bit line BL can be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals to communicate with an external memory controller and/or host processor (not shown). The external terminals can include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from an external memory controller and/or host processor. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD can be provided as internal command signals ICMD to a command decoder 115 via the command/address input circuit 105. The command decoder 115 can include a processor 116 and/or other circuits to decode the internal command signals ICMD to generate various internal signals and commands for performing memory operations. For example, the processor 116 can execute the instructions to and/or other circuits can be configured to generate row and column command signals and/or the associated timing signals (e.g., in coordination with the timing generator 135) to select a word line and/or a bit line to perform the desired memory operation. Of course, the processor/circuitry to generate the command and/or timing signals can be located in another component of the memory device 100 such as, for example, address command input circuit 105 and/or an external controller/processor. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160 and supplied via the input/output circuit 160 and the read/write amplifiers 155 to the memory array 150. The write data may be written in the memory cell designated by the row address and the column address. The write data may be provided to the data terminals at a time that is defined by write latency WL information. Operation of the I/O circuit 160 is known to those skilled in the art and thus, for brevity, will not be discussed.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, VCC, VCCP, VCCP2, and the like based on the power supply potentials VDD, VNWL, and VSS. The internal potential VPP can be used in the row decoder 140, the internal potentials VOD and VARY can be used in the sense amplifiers included in the memory array 150, and the internal potential VPERI can be used in many other circuit blocks.

Clock input circuit 120 can receive external clock signal and generate various internal clock signals. For example, the clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (TO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

As seen in FIG. 1, memory devices can be complex and dense, which limits the access for testing internal components using eternal testers. Accordingly, in exemplary embodiments of the present disclosure, the memory device can include one or more on-chip device testing circuits (e.g., testing circuits 180a-f, collectively 180) (and/or portions of testing circuits). In some embodiments, the testing circuits 180 can be distributed within the memory device 100 so that components connected to respective local power buses can be selectively tested. For example, the memory device 100 can have one or more testing circuits 180 (or a portion of a testing circuit) to test components within the memory device 100 such as, for example, testing circuit 180a to test the command/address input circuit 105, testing circuit 180b to test the clock input circuit 120, testing circuit 180c to test the timing generator 135, testing circuit 180d to test the internal clock circuit 130, testing circuit 180e to test the IO circuit 160, testing circuit 180f to test the voltage generator 170, and/or another testing circuit to test another component within memory device 100. One or more testing circuits 180 can be connected to each local power bus of each component and/or a testing circuit 180 can be connected to one or more local power buses. Each testing circuit 180 can include a pull-down circuit and/or a noise generator circuit. For example, in some embodiments, some or all testing circuits 180 can include a pull-down circuit and a noise generator circuit. In other embodiments, some or all testing circuits 180 may only include the pull-down circuit portion. In cases where the local testing circuit only includes the pull-down circuit, the memory device 100 can include a centralized noise generator circuit 185 (shown with a dotted outline) that can be configured to selectively connect to one or more of the testing circuits 180 that only include the pull-down circuit. In the embodiment of FIG. 1, the "NGC" of each testing circuit 180 is shown in parentheses to indicate the local noise generator circuit can be optionally omitted when a central noise generator circuit 185 is included. In some embodiments, one or more testing circuits 180 can be "on-chip" testing circuits. "On-chip" means that at least a portion of the electronics (e.g., transistors, logic gates, etc.) of the testing circuit is formed on the substrate of a semiconductor die of the memory device 100. In some cases, one or more testing circuits 180 can include terminals to connect to testing and/or monitoring equipment that may be located "off-chip" (e.g., to receive noise source signal(s) from signal generators and/or act as test points for evaluating the effects of the testing circuit 180 on the component, etc.). The pull-down circuit and the noise generator circuit are described in detail below. In some embodiments, the on-chip testing circuits can be disabled prior to shipment to a customer.

Figure 2:
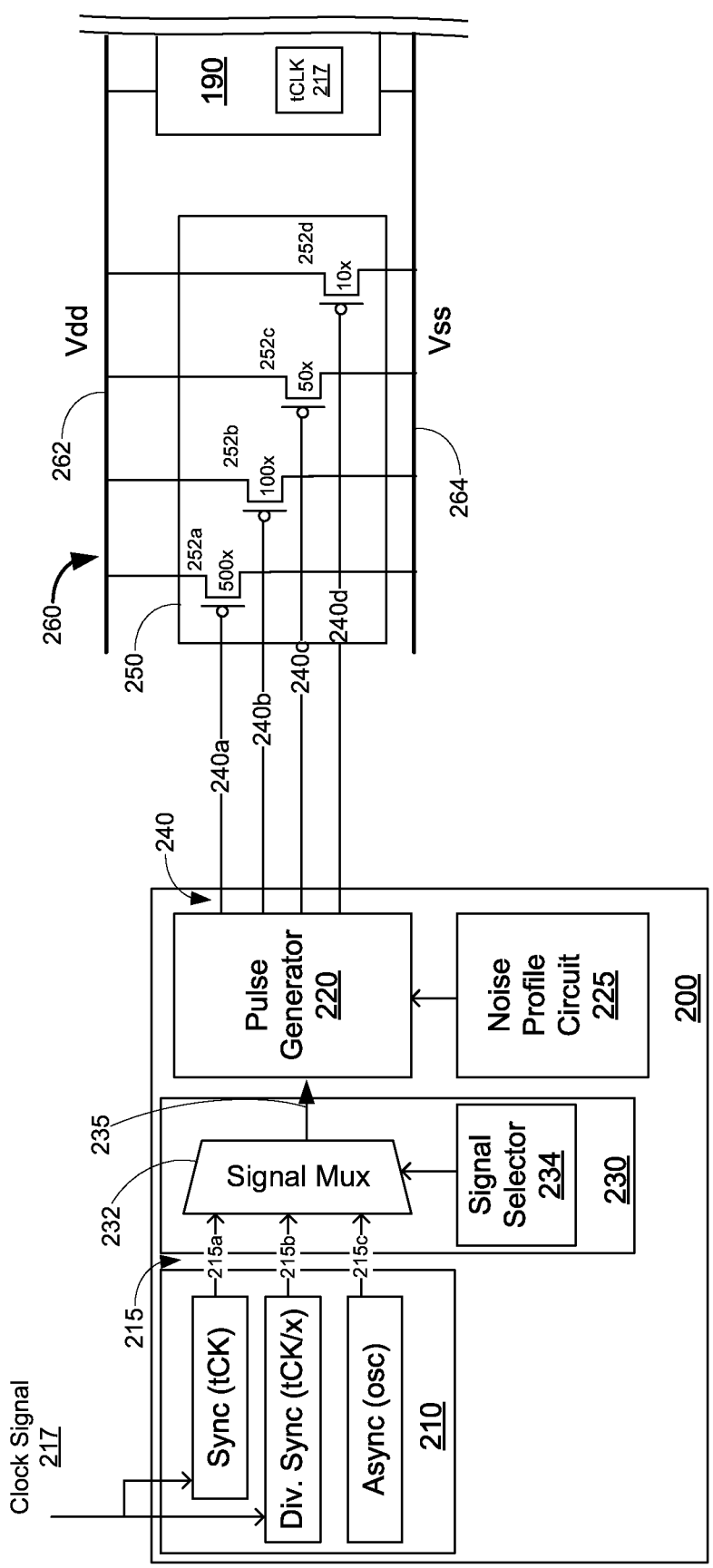
FIG. 2 is a block diagram of a noise generator circuit and a pull-down circuit that can be incorporated into the on-chip device testing circuits of FIG. 1.

FIG. 2 illustrates an exemplary embodiment of a noise generator circuit 200 connected to a pull-down circuit 250 in accordance with an embodiment of the present disclosure.

The pull-down circuit 250 is connected to a local power bus 260 (also referred to herein as the "target bus") corresponding to a component 190 that is being tested. The local power bus 260 can provide the power to the component 190, which can represent one or more of the circuits in memory device 100 (e.g., one or more of the circuits discussed above with reference to FIG. 1). For example, one or more noise generator circuits 200 and/or the pull-down circuits 250 can be incorporated into one or more of the device testing circuits 180 (or 185) of FIG. 1. The noise generator circuit 200 can include a noise source circuit 210, pulse generator circuit 220, and a noise profile circuit 225.

In some embodiments, the noise generator circuit 200 can generate (and/or be connected to) one or more noise source signals that can be used to simulate (and/or exaggerate) a real-world noise in the memory device. For example, in some embodiments, noise source signal circuit 210 can generate one or more noise source signals 215 that can be, for example, oscillating signals. The noise source signal circuit 210 can output the noise source signal(s) 215, which can be used to drive the input of the pulse generator 220. Alternatively, or in addition to generating the noise source signal(s) 215, the noise source signal circuit 210 can be connected to a connector or connectors (e.g., external terminals) that can receive one or more noise source signals from, for example, an external test apparatus. The noise source signal 215 can be a synchronous signal and/or an asynchronous signal. For example, the noise source signal 215 can be an oscillating signal that is synchronized to a local clock signal corresponding to the target bus. Depending on the location of the target bus, the local clock signal used for synchronization can be, for example, an external clock signal (e.g., clock signals CK and/or CKF and/or another external clock signal) and/or an internal clock signal (e.g., clock signal ICLK, clock signal TO, a clock signal corresponding to a data path such as, for example, read path and/or write path, a clock signal corresponding to a command path, and/or a clock signal corresponding to another signal path), and/or another clock signal of the memory device 100. For example, if a local power bus in the clock input circuit 120 is being tested, the local clock signal, which can be used as the reference synchronization signal, can be the internal clock signal ICLK and/or the external clock signal CK or CKF. Similarly, if the target bus corresponds to another circuit/component in memory device 100, the local clock signal can correspond to the appropriate clock used within that circuit. In the embodiment of FIG. 2, the target bus is power bus 260 connected to component 190. In this embodiment, synchronous noise source signals can be synchronized to the local clock signal 217 of component 190, which can act as the reference synchronization clock signal. In some embodiments, the asynchronous noise source signal 215 can be based on a self-refresh oscillator, based on on-die events (e.g., refresh events, read/write events), based on a self-timer, random, etc. The circuits to generate synchronous and asynchronous signals are known to those skilled in the art and thus, for brevity, a detailed description is omitted.

In some embodiments, in order to test a target bus, the noise generator circuit 200 can be configured to select from one or more noise source signals 215 that are synchronous signals, asynchronous signals, or a mix of synchronous and asynchronous signals. For example, as seen in FIG. 2, the noise source circuit 210 can generate and/or be connected to a noise source signal 215a that is a synchronous signal corresponding to, for example, the local clock signal 217, a noise source signal 215b that is a synchronous signal corresponding to a lower frequency than the local clock signal 217, and/or a noise source signal 215c that is an asynchronous signal. In the exemplary embodiment, the noise source signal 215a represents a signal that is at the same frequency as the frequency (tCLK) of the local clock signal 217, and the noise source signal 215b represents a signal that is at a lower frequency (tCLK/x) by a factor x (where x is an integer greater than 1) than that of the local clock signal 217. In some embodiments, the synchronous noise source signal 215 can be at a higher frequency than the local clock signal. In some embodiments, the asynchronous noise source signal 215c can be an oscillating signal that is at a random frequency or a predetermined frequency. The synchronous signal can be at a frequency that is higher, lower or at the same frequency (but not synchronized) as that of the local clock signal (e.g., clock signal 217).

To select a noise source signal when multiple noise source signals 215 are available, in some embodiments, the noise generator circuit 200 can include a noise signal selector circuit 230 that is configured to select one of the noise source signals 215 and output it as a noise pulse signal 235. For example, the noise signal selector circuit 230 can include a signal multiplexer circuit 232 (and/or a similar selection circuit) that is configured to receive one or more noise source signals 215 as inputs and output the selected signal as noise pulse signal 235 to the pulse generator circuit 220. In some embodiments, the noise signal selector circuit 230 can include a signal selector circuit 234 that controls which noise source signal 215 to the signal multiplexer 232 to select. In some embodiments, the signal selector circuit 234 can include a fuse circuit (and/or an anti-fuse circuit, latch circuit, etc.) that is configured to select an appropriate noise source signal 215 based on the target bus being tested. In some embodiments, the selector switch circuit 234 can be configured to accept inputs from an operator, for example, when performing a manual test mode operation on the target bus. In still other embodiments, the signal selector circuit 234 can be configured to cycle between one or more of the noise source signals 215 based on, for example, a predetermined sequence or a random sequence. In the illustrated embodiment, the signal multiplexer circuit 232 receives three inputs (e.g., noise source signals 215a-c), but, in other embodiments, the signal multiplexer circuit 232 can receive more than or less than three noise source signals as inputs and can include any combination of synchronous and asynchronous signals. In some embodiments, if a single noise source signal 215 is used, the noise signal selector circuit 230 may be omitted and the single noise source signal 215 can be input to the pulse generator circuit 220.

The pulse generator circuit 220 can provide one or more pulse outputs based on noise pulse signal 235. After receiving the noise pulse signal 235 from the multiplexer 230 (and/or a noise source signal 215 directly from the noise source generator 210, depending on the number of noise source signals), the pulse generator circuit 220 can output one or more noise profile signals 240 (e.g., noise profile signals 240a-d) that control the pull-down circuit 250. In some embodiments, one or more of the noise profile signals 240 can be selectively enabled (e.g., the sub-circuit that outputs the noise profile signal is enabled) by, for example, a noise profile circuit 225. The selective enablement of the noise profile signals 240 can be based on, for example, a noise test profile to be applied to the target bus. Alternatively, or in addition to selectively enabling noise profile signals 240, in some embodiments, based on, for example, the noise test profile to be applied to the target bus, the noise profile circuit 225 can also control a pulse width of one or more noise profile signals 240 output from the pulse generator circuit 220. For example, the noise profile circuit 225 can be configured to shorten, extend, or maintain the pulse widths of the one or more noise profile signals 240 in comparison to the pulse width of the input noise pulse signal 235.

The noise test profile relates to a limit or limits corresponding to one or more parameters of the target bus (e.g., a power parameter, current parameter, and/or a voltage parameter related to the target bus). For example, the noise test profile can correspond to respective predetermined values (and/or respective predetermined ranges) for the one or more parameters of the target bus. In some embodiments, the noise test profile can correspond to a predetermined value (and/or a predetermined range of values) for a magnitude of deflection of a voltage amplitude of the target bus. The deflection can be in comparison to a reference value (e.g., a steady state value or average value of the target bus during normal operation). In another embodiments, the noise test profile can correspond to a predetermined value (and/or a predetermined range of values) for a frequency of the voltage amplitude deflection (e.g., the frequency at which the target bus is shorted). That is, in some embodiments, noise generator circuit 200 is configured so as to intermittently short the target bus such that the deflection magnitude and/or the deflection frequency of the voltage amplitude meets a predetermined value (and/or is within a predetermined range of values). The noise test profile can be set and/or modified as necessary so that the pull-down circuit (e.g., pull-down circuit 250), which is operated based on the noise test profile, can simulate and/or exaggerate the real-world noise that the components of memory device 100 can experience. In some embodiments, the noise test profile limits at the start of the testing can be small in order to see if the component being tested fails when the target bus only has a small amount of noise (e.g., there is only a small voltage amplitude deflection and/or the frequent of the shorting is low). As the testing progresses, the noise test profile limits for the target bus can be increased in order to see when the component being tested will fail. In doing so, the noise test profile can go from a weak testing sequence to a strong testing sequence so that the induced noise on the target bus can provide a "shake the box" test method that can decrease the time to failure of a component being tested (e.g., a component that susceptible to failure), which can speed up the debugging process for the memory device 100. The weak to strong testing sequence can be a manual sequence and/or an automated sequence and can be performed in a stepwise manner or in a continuous manner. In some embodiments, the noise test profile can be the same or similar for one or more of the target buses (e.g., the same or similar for all the target buses). In other embodiments, because the RC time constants of power buses can be different between the local power buses of a memory device 100, the noise test profile can be target bus specific. Thus, in exemplary embodiments of the present disclosure, the noise generator circuit 200 can be configured to selectively enable one or more noise profile signals 240 and/or the control pulse width values of one or more noise profile signals 240 to account for power buses with different characteristics. In some exemplary embodiments, one or more target buses can be selectively tested using one or more noise generator circuits 200.

Figure 3A:
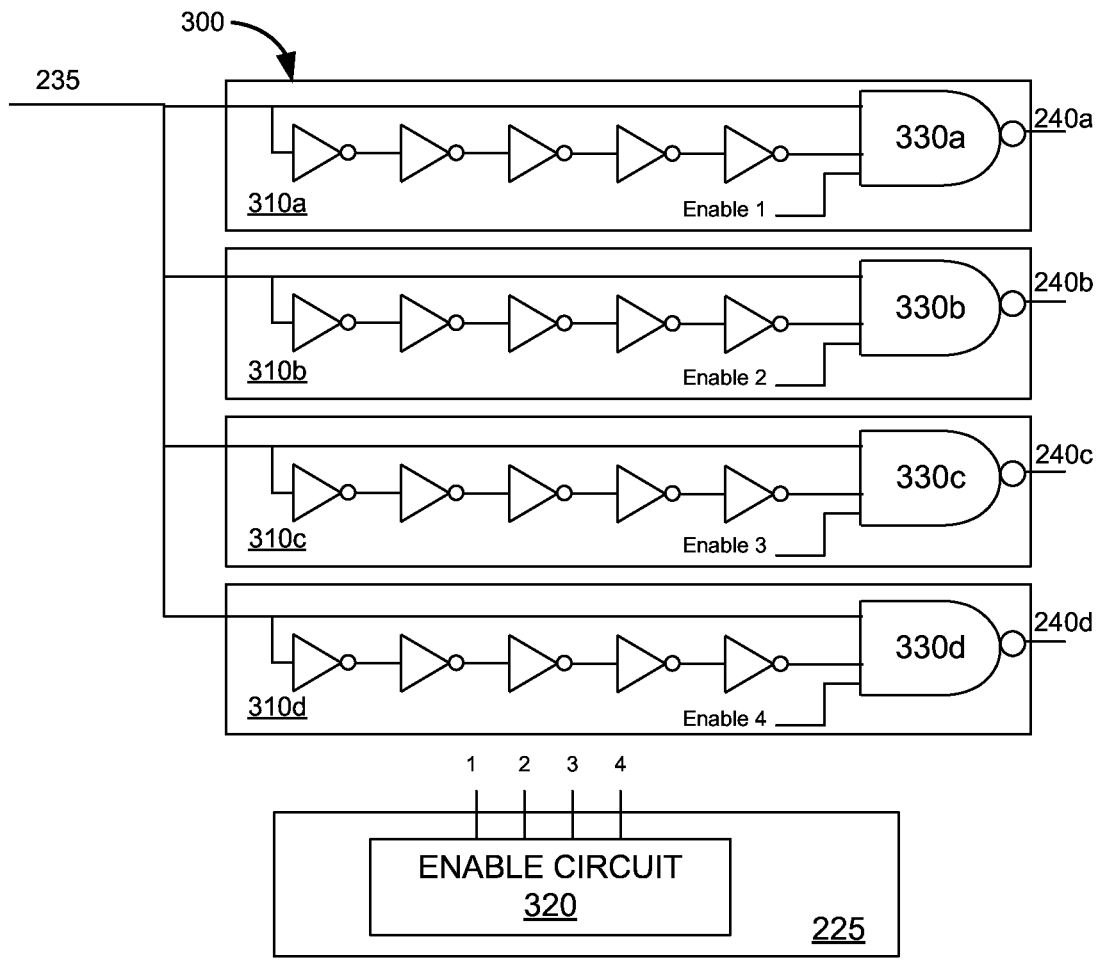
FIG. 3A is a block diagram of an exemplary pulse generator circuit with an enable circuit that can be incorporated into the noise generator circuit of FIG. 2.

The pulse generator circuit 220 of noise generator circuits 200 can be any known configuration such as, for example, a delayed input pulse generator, an S-R latch pulse generator, etc. The pulse generator circuits can be configured to trigger on the rising edge or the falling edge and can be configured to provide a high pulse output or a low pulse output depending on the configuration of the bus shorting circuit. For example, FIG. 3A illustrates an embodiment of a pulse generator circuit 300 that can be incorporated into the pulse generator circuit 220. The pulse generator circuit 300 includes four pulse generator sub-circuits 310a-d that respectively output noise profile signals 240a-d. In some embodiments, as shown in FIG. 3A, one or more of the pulse generator sub-circuit 310a-d can be a delayed input pulse generator. As seen in FIG. 3A, each pulse generator sub-circuit can be enabled by receiving a respective enable signal (e.g., enable 1, enable 2, enable 3, and enable 4). In the embodiment of the FIG. 3A, the respective NAND gate 330a-d is configured to receive the enable signal, but other logic circuits can be used. In some embodiments, the noise profile circuit 225 can include an enable circuit 320 that can selectively enable one or more pulse generator sub-circuits 310a-d based on, for example, the noise test profile to be applied to the target bus. In some embodiments, one or more of the enable signals (e.g., enable 1, enable 2, enable 3, and/or enable 4) enable circuit 320 can be set manually by an operator during a test mode operation and/or set using a fuse circuit (and/or anti-fuse circuit, latch circuit, etc.).

As shown in FIG. 3A, a first input of each NAND gate 330a-d immediately receives the input pulse signal 235 and a second input receives an inverted noise pulse signal after a predetermined delay. In some embodiments, each noise generator sub-circuit 310a-d can include an inverter delay circuit that receives the noise pulse signal 235 and outputs an inverted signal to the second input after the predetermined delay. In the embodiments of FIG. 3A, the inverter circuit includes five inverters connected in series to provide a predetermined delay that equals a five-inverter delay. That is, the pulse width of the output noise profile signal 240 corresponds to the predetermined delay on the inverter circuit. In this case, because of the five-inverter delay, the pulse width of the output noise profile signal 240 is a five-inverter wide pulse. However, in other embodiments, the inverter circuit can include any odd number of delay inverters to provide a desired output pulse width that can be less than or equal to the input pulse width of noise pulse signal 235. In addition, embodiments of the present disclosure are not limited to the delayed-input type pulse generator sub-circuit 310 and/or use of an inverter circuit to provide the desired pulse width. Those skilled in the art will recognize that other known configurations of a pulse generator circuit and/or other known pulse width logic circuits can be used so long as the pulse generator circuit provides an output pulse that controls the pull-down circuit (or another type of bus shorting circuit). In the embodiment of the FIG. 3A, all the circuits provide an output signal with the same fixed pulse width (e.g., five-inverter pulse width). However, in other embodiments one or more of the pulse generator sub-circuits can provide an output signal having a different pulse width value than those of the other pulse generator sub-circuits. In the embodiment of FIG. 3A, the pulse width of the noise profile signal 240 is less than or equal to the pulse width of the noise pulse signal 235 depending on the configuration of the inverter circuit. However, in other embodiments, depending on the type of noise generator sub-circuit, the pulse width of the output noise profile signal 240 can be greater than, less than, or the same as the pulse width of the noise pulse signal 235.

Figure 3B:
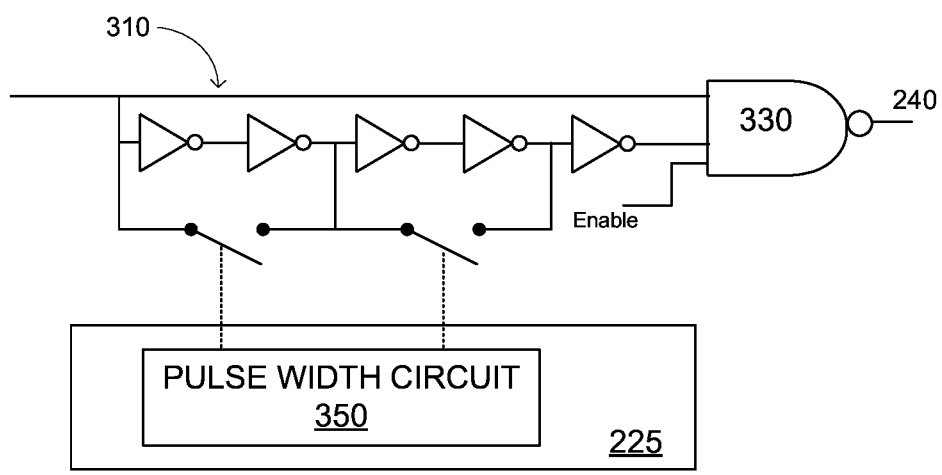
FIG. 3B is a block diagram of an exemplary pulse generator circuit with an enable circuit that can be incorporated into the noise generator circuit of FIG. 2.

In some embodiments, instead of a fixed pulse width, the pulse width of one or more of the noise profile signals can be variable and can be set (or changed), for example, based on the noise test profile to be applied to the target bus. For example, in some embodiments, the noise profile circuit 225 can include a pulse width circuit 350 that can set (e.g., selectively) the pulse width of one or more pulse profile signals 240 based on the noise test profile to be applied to the target bus. As seen in FIG. 3B, inverters can be appropriately bypassed in order to set the output pulse width of noise profile signal 240. For example, an open/close switch (or another type of circuit such as a fuse circuit, anti-fuse circuit, etc.) can be arranged in parallel with a pair of inverters such that the inverters are bypassed when the switch is closed. In the embodiments of FIG. 3B, the five-inverter delay circuit includes two bypass switches such that, based on the output (s) from the pulse width circuit 350, the pulse width of the output noise profile signal 240 can be set to a one-inverter pulse width (both switches closed), a three-inverter pulse width (one switch closed and one switch open), or a five-inverter pulse width (both switches open). The pulse width can be set (e.g., bypass inverters) manually by an operator during a test mode operation and/or set using a fuse circuit (and/or anti-fuse circuit, latch circuit, etc.). Embodiments of the present disclosure are not limited to the pulse width circuit 350, and in other embodiments, any known configuration of a pulse generator circuit that provides an output pulse at a desired pulse width to control the pull-down circuit can be used.

During testing of the target bus, the enabled noise generator sub-circuit(s) 310a-d can output a noise profile signal (e.g., noise profile signal 240a-d) at the configured pulse width to control the pull-down circuit 250. The pulse shape of the output noise profile signal (e.g., high pulse or low pulse) will depend on the type of switches (e.g., transistors) that are being controlled. For example, in the embodiment of FIG. 2 in which the pull-down circuit 250 includes PMOS transistors, the pulse shape of the output noise profile signal can be a low pulse signal (e.g., goes from high or "1" with PMOS transistor open to a low or "0" with the PMOS transistor closed and back to a high) when the input noise pulse signal 235 provides a high pulse signal (e.g., goes from low to high and back down to low). In other embodiments, the pulse shapes of the input and output signals to the noise generator can be different depending on the configuration of the various circuits.

As discussed above, the pulse generator circuit 220 outputs one or more noise profile signals 240 to control the pull-down circuit 250. The noise profile signals 240 can operate one or more switches (e.g., transistors) in the pull-down circuit 250, which is connected to a power bus 260. As seen in FIG. 2, the pull-down circuit 250 includes one or more switches 252 that connect a positive rail 262 of the power bus 260 to a negative rail 264 of the power bus 260. For example, the pull-down circuit 250 can include a plurality of switches 252 (e.g., switches 252a-d) that can be PMOS transistors. However, those skilled in the art understand that in other embodiments of the bus shorting circuit, the switches can be NMOS transistors and/or another type of transistor. The switches 252 can be arranged in a parallel configuration with the source of each switch 252 connected to the positive rail 262 and the drain of each switch 252 connected to the negative rail 262. The gate of each switch 252 (e.g., switches 252a-d) can be connected to a corresponding noise profile signal 240 (e.g., noise profile signals 240a-d) output from the pulse generator circuit 220. In some embodiments, each output of the pulse generator circuit 220 can be connected to and drive one or more switches 252. For example, as illustrated in FIG. 2, each noise profile signal 240 output from pulse generator circuit 220 can drive a single switch 252. However, in other embodiments, a single noise profile signal 240 output from pulse generator circuit 220 can drive two or more switches 252.

In some embodiments, all the switches in the pull-down circuit 250 can have the same channel size (e.g., width and length of the channel of a transistor are all the same). However, in other embodiments, one or more of the switches can have a channel dimension (e.g., width and/or length) that is different from that of at least one other switch. As used herein, "length" refers to a distance between the drain side and source side of the transistor channel, and "width" refers to the transistor channel dimension that is perpendicular the channel length. In some embodiments, the channel size (e.g., width and/or length) of the transistor can be a multiple of a standard transistor used in the apparatus. As seen in FIG. 2, the width of switch 252a can be 500 times that of a standard PMOS transistor found in the memory device 100. Similarly, switches 252b,c, and d can respectively have widths that are 100 times, 50 times, and 10 times that of a standard PMOS transistor of the memory device 100. The channel size (width and/or length) of the switch can affect the noise test profile by setting, for example, the amount of deflection of the power signal amplitude. For example, the width of the switch can be proportional to the amount (or magnitude) of deflection of the voltage amplitude and the length of the switch can be inversely proportional to the amount (or magnitude) of deflection of the voltage amplitude on the target bus. In some embodiments, based on the noise test profile to be applied to the target bus, the noise generator circuit 220 selects switches (e.g., via enabling the appropriate pulse generator sub-circuits) having the appropriate channel sizes (e.g., width and/or length) to ensure the pull-down circuit provides, for example, the proper voltage amplitude deflection (e.g., magnitude and/or frequency) on the target bus. In addition, the selection of switches 252 based on the channel size (e.g., width and/or length) can take into account the RC characteristics of the target bus. When applying a noise test profile to a target bus, a bus having a high RC time constant may require the selection of switches having a larger width than a bus with a smaller RC time constant. For example, if a greater voltage amplitude deflection is required and/or desired, the noise profile circuit 225 can be set to enable noise profile signal 240a for switch 252a, which has the largest width (and/or enable one or more of the other noise profile signals 240b-d corresponding to switches 252b-d). Alternatively, or in addition to enabling an output based on channel size and/or the number of outputs, the noise profile circuit 225 can set the pulse width of the enabled outputs to a larger value. If a lesser voltage amplitude deflection is desired, the noise profile circuit 225 can be set to enable noise profile signal 240d for switch 252d, which has the smallest width. Alternatively, or in addition to enabling an output based on channel size and/or the number of outputs, the noise profile circuit 225 can set the pulse width of the enabled outputs to a smaller value. Accordingly, in some embodiments, the enabling of one or more outputs of the pulse generator circuit 220 (e.g., noise profile signals 240a-d) by the noise profile circuit 225 can include a consideration of the channel size of the switch (e.g., switches 252a-d) in the pull-down circuit. Thus, the noise profile circuit 225 can set the shape of the noise induced on the target bus by setting the number of enabled outputs, including taking into consideration the switch sizes of the enabled outputs, and/or setting the pulse widths of the enabled outputs based on a noise test profile to be applied on the target bus.

In some embodiments, the number and channel sizes of the switches can be standardized between pull-down circuits such that a selection of which switch(es) to control and the pulse width(s) used in the control can be readily determined based on the noise test profile to apply on the target bus and the characteristics of the target bus (e.g., RC time constant). In some embodiments, the number of switches and/or the switches can be uniformly sized across all pull-down circuits and/or across pull-down circuits connected to buses having similar characteristics (e.g., similar RC time constants). For example, the number of switches can be four and/or the widths of the switches can be 500×, 100×, 50×, and 10× across all testing circuits 180 in memory device 180 and/or across all testing circuits 180 connected to power buses with similar characteristics.

In some embodiments, as discussed above, the configuration of the noise profile circuit 225 (e.g., the configuration of the enable circuit 320 and/or the pulse width circuit 350) can be done manually by an operator during a test mode operation and/or using a fuse circuit (and/or anti-fuse circuit, latch circuit, etc.). Alternatively, or in addition to a manual setting, the configuration of noise profile circuit 225 (e.g., the configuration of the enable circuit 320 and/or the pulse width circuit 350) can be done automatically. In some embodiments, the automatic configuration can be done based on predetermined criteria or a random sequence. For example, the predetermined criteria can include the target bus being tested, the characteristics (e.g., RC time constant) of the target bus, the type of test being performed, the type of noise source signal being input, the type of feedback being evaluated during the test, and/or some other criteria. In some embodiments, the configuration of the noise profile circuit 225 can be done based on a random sequence by, for example, one or more linear Feedback shift register (LFSR) circuits. For example, the enable circuit 320 can include a LFSR circuit to randomly enable one or more of the noise generator sub-circuits 310a-d. In some embodiments, only one noise generator sub-circuits 310a-d is randomly enabled at a time. In other embodiments, more than one noise generator sub-circuits 310a-d is randomly and simultaneously enabled. Similarly, in some embodiments, pulse width circuit 350 can include a LFSR circuit to randomly select the pulse width values of the enabled outputs of the noise generator 220. In some embodiments, when more than one output is enabled, the randomly selected pulse width value is the same for all the enabled outputs. In some embodiments, when more than one output is enabled, the randomly selected pulse width value is different for at least one of enabled outputs. In some embodiments, noise profile circuit 225 is configured such that the random enablement of the one or more of the noise generator sub-circuits 310a-d and/or the random selection of the pulse width values can produce a Gaussian profile for the generated noise on the target bus. LFSR circuits are known in the art and thus, for brevity, a detailed description is omitted.

Figure 4:
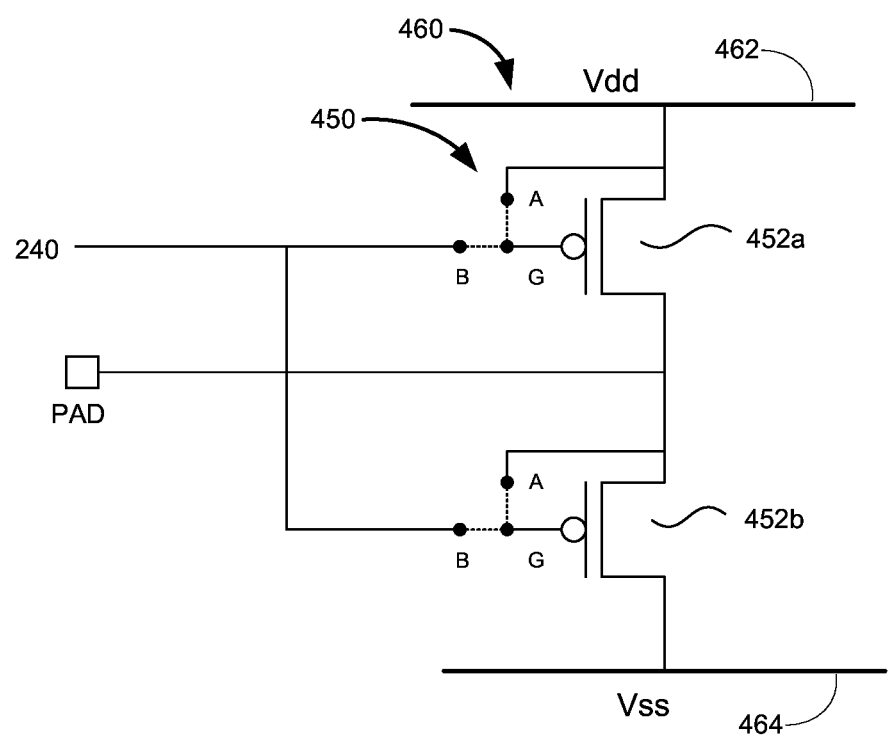
FIG. 4 is a block diagram of pull-down circuit that can incorporated into an electrostatic discharge device.

In some embodiments, the bus shorting circuit (e.g., pull down circuit 250) can be a new circuit that is added to the memory device 100. However, in other embodiments, some or all of the bus shorting circuits can be incorporated into existing circuits (e.g., existing circuits with MOS transistors) of the memory device 100. For example, in some embodiments, the bus shorting circuit can be incorporated in circuits that have diode-connected transistors, cross-connected diodes, etc. For example, the bus shorting circuit can be incorporated into an electrostatic discharge device (ESD) of the memory device 100. A typical memory device 100 can have ESD circuits attached to every external pad connection and between power buses within the memory device 100 for protection from power surges. FIG. 4 illustrates an exemplary embodiment of a portion of an ESD circuit incorporating a pull-down circuit. The hybrid EDS/PDC device 450 includes two PMOS transistors 452a and 452b connected in series between rails 462 and 464 of power bus 460. During normal operation, the connections between G and A (dotted lines) in each transistor 452a and 452b are closed (e.g., via fuse circuits, anti-fuse circuits, etc.) to form diode-connected transistors. During normal operation, the connections between G and B (dotted lines) in each transistor 452a and 452b are open (e.g., via fuse circuits, anti-fuse circuits, etc.) so that the noise generator circuit 220 is not connected. If the memory device 100 is selected to be tested, the connections between G and A (dotted lines) in each transistor 452a and 452b can be opened (e.g., via fuse circuits, anti-fuse circuits, etc.) and the connections between G and B (dotted lines) in each transistor 452a and 452b are closed (e.g., via fuse circuits, anti-fuse circuits, etc.) to form a pull-down circuit that is connected to the noise generator circuit 220. The power bus 460 can include similar circuits so that one or more pull-down circuits can be configured for power bus 460 based on incorporating a pull-down circuit into a ESD circuit. Similarly, other circuits (e.g., protection circuits between internal buses and/or other circuits) in memory device 100 can be used to incorporate the bus shorting circuits. Thus, exemplary embodiments of the present disclosure can take advantage of existing MOS devices to minimize any increase, if any, in the size of the memory device.

A processing device can represent one or more general-purpose processing devices such as a microprocessor, a central processing unit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. A processing device can also be one or more special-purpose processing devices such as an application specific integrated circuit (ASIC), a field programmable gate array (FPGA), a digital signal processor (DSP), network processor, or the like. The processing device is configured to execute instructions for performing the operations and steps discussed herein.

The machine-readable storage medium (also known as a computer-readable medium) on which is stored one or more sets of instructions or software embodying any one or more of the methodologies or functions described herein. The machine-readable storage medium can be, for example, memory device 100, or another memory device. The term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps may be presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. For example, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." Additionally, the terms "comprising," "including," "having," and "with" are used throughout to mean including at least the recited feature(s) such that any greater number of the same feature and/or additional types of other features are not precluded.

It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. An apparatus, comprising:
a bus shorting circuit connected between a first rail of a power bus supplying power to a component of a memory device and a second rail of the power bus; and
a pulse generator circuit connected to the bus shorting circuit and configured to intermittently connect the first rail to the second rail to induce noise on the power bus, wherein the induced noise is based on a noise test profile for the power bus, the noise test profile corresponding to a magnitude limit on a deflection of a voltage amplitude of the power bus.

2. The apparatus of claim 1, wherein the bus shorting circuit includes a plurality of transistors connected in parallel between the first rail and the second rail, and wherein the pulse generator circuit provides a plurality of output signals, each output signal corresponding to a transistor of the plurality of transistors and controlling the operation of the respective transistor.

3. The apparatus of claim 2, further comprising:
a noise profile circuit connected to the pulse generator circuit and configured to at least one of enable at least one output signal of the plurality of output signals or set a pulse width of an enabled output signal.

4. The apparatus of claim 3, wherein at least one of the enabling of the output signal or the setting of the pulse width is based on setting the magnitude of the deflection of the voltage amplitude of the power bus.

5. The apparatus of claim 3, wherein the noise profile circuit includes at least one of a first linear feedback shift register configured to randomly enable the at least one output signal of the plurality of output signals or a second linear feedback shift register configured to randomly select a pulse width value for the pulse width.

6. The apparatus of claim 5, wherein the noise profile circuit is configured such that the random enablement of the at least one output signal of the plurality of output signals and/or the random selection of the pulse width value produces a Gaussian profile for the induced noise on the power bus.

7. The apparatus of claim 3, wherein the noise profile circuit is configured to enable the at least one output signal of the plurality of output signals based on a channel size of a transistor of the plurality of transistors.

8. The apparatus of claim 1, further comprising:
a noise source circuit connected to the pulse generator circuit and configured to generate at least one noise source signal that simulates a real-world noise.

9. The apparatus of claim 8, wherein the at least one noise source signal is a plurality of noise source signals that include at least one of an asynchronous oscillating signal or a synchronous oscillating signal.

10. The apparatus of claim 9, wherein the synchronous oscillating signal is synchronized to a clock signal corresponding to the component, the synchronous oscillating signal having a same or lower frequency than the clock signal.

11. The apparatus of claim 1, wherein the bus shorting circuit is a pull-down circuit comprising a plurality of PMOS transistors connected in parallel.

12. The apparatus of claim 1, wherein the bus shorting circuit is incorporated into an electrostatic device circuit of the memory device.

13. An apparatus, comprising:
a power bus supplying power to a component of a memory device and having a first rail and a second rail;
a noise source circuit generating a plurality of noise source signals that simulate a real-world noise;
a multiplexer circuit configured to select and output a noise source signal from the plurality of noise source signals;
a pulse generator circuit connected to the multiplexer circuit to receive the noise source signal and output at least one noise profile signal based on the noise source signal; and
a bus shorting circuit connected to the pulse generator circuit to receive the at least one noise profile signal, the bus shorting circuit having at least one transistor connected between the first rail and the second rail of the power bus,
wherein the bus shorting circuit is configured, based on the at least one noise profile signal, to intermittently connect the at least one transistor between the first rail to the second rail to induce noise on the power bus, wherein the at least one transistor is a plurality of transistors connected in parallel between the first rail and the second rail, wherein the at least one noise profile signal is a plurality of noise profile signals, each noise profile signal corresponding to a transistor of the plurality of transistors and controlling the operation of the respective transistor, and wherein the apparatus further comprises:

a noise profile circuit connected to the pulse generator circuit and configured to at least one of enable one or more first noise profile signals of the plurality of noise profile signals or set a pulse width of a noise profile signal.

14. The apparatus of claim 13, wherein the noise profile circuit includes at least one of a first linear feedback shift register configured to randomly enable the one or more first noise profile signals or a second linear feedback shift register configured to randomly select a pulse width value for the pulse width, and wherein the noise profile circuit is configured such that the random enablement of the one or more first noise profile signals and/or the random selection of the pulse width value produces a Gaussian profile for the induced noise on the power bus.

15. A method, comprising:

supplying power to a component of a memory device using a power bus having a first rail and a second rail; and inducing noise on the power bus by intermittently shorting the first rail to the second rail using at least one transistor connected between the first rail and the second rail, wherein the inducing of the noise is based on a noise test profile for the power bus, the noise test profile corresponding to a magnitude limit on a deflection of a voltage amplitude of the power bus.

16. The method of claim 15, further comprising:

setting, based the noise test profile, the magnitude of the deflection of the voltage amplitude of the power bus by at least one of enabling at least one noise profile signal to operate the at least one transistor or setting a pulse width of a noise profile signal.

17. A method, comprising:

supplying power to a component of a memory device using a power bus having a first rail and a second rail;

inducing noise on the power bus by intermittently shorting the first rail to the second rail using at least one transistor connected between the first rail and the second rail; and at least one of randomly enabling at least one noise profile signal to operate the at least one transistor or randomly setting a pulse width value for a pulse width of a noise profile signal to produce a Gaussian profile for the induced noise on the power bus.

* * * * *